United States Patent
Nolan

(10) Patent No.: US 7,348,111 B2
(45) Date of Patent: Mar. 25, 2008

(54) REDUCTION OF IMAGING ARTIFACTS IN A PLATESETTER HAVING A DIFFRACTIVE MODULATOR

(75) Inventor: John F. Nolan, Bradford, MA (US)

(73) Assignee: Agfa Corporation, Wilmington, MA (US)

( * ) Notice: Subject to any disclaimer, the term of this patent is extended or adjusted under 35 U.S.C. 154(b) by 770 days.

(21) Appl. No.: 10/845,042

(22) Filed: May 13, 2004

(65) Prior Publication Data

US 2004/0248021 A1    Dec. 9, 2004

(51) Int. Cl.
*G03F 9/00* (2006.01)
*B41J 2/47* (2006.01)
*G02F 1/07* (2006.01)

(52) U.S. Cl. .................. 430/30; 347/239; 347/255; 359/247; 359/291; 430/945

(58) Field of Classification Search .................. 430/30, 430/945; 359/247, 291; 347/239, 255
See application file for complete search history.

(56) References Cited

U.S. PATENT DOCUMENTS

| 6,229,650 | B1 | 5/2001 | Reznichenko et al. | |
|---|---|---|---|---|
| 6,894,822 | B2 * | 5/2005 | Blech et al. | 359/247 |
| 7,218,339 | B2 * | 5/2007 | Jacobs | 348/42 |
| 2006/0109088 | A1 | 5/2006 | Sagan | |

OTHER PUBLICATIONS

"Calibration of a Scanned Linear Grating Light Valve Projection System" by R.W. Corrigan et al., Silicon Light Machines, Sunnyvale CA., presented at Society for Information Display Symposium, May 18, 1999, San Jose, CA.

"Grating Light Valve Technology for Projection Displays" by R.W. Corrigan et al., Silicon Light Machines, Sunnyvale, CA., presented at the International Display Workshop, Kobe Japan, Dec. 9, 1998, Paper No. LAD5-1.

"Grating Light Valve Technology: Update and Novel Applications" by D.T. Amm et al., Silicon Light Machines, Sunnyvale, CA., presented at Society for Information Display Symposium, May 19, 1998, Anaheim, CA.

"Optical Performance of the Grating Light Valve Technology" by David T. Amm et al., Silicon Light Machines, Sunnyvale, CA., presented at Photonics West-Electronic Imaging, Jan. 27, 1999, San Jose, CA.

* cited by examiner

*Primary Examiner*—Christopher G. Young
(74) *Attorney, Agent, or Firm*—Robert A. Sabourin

(57) ABSTRACT

A platesetter may have an optical imaging head which includes a diffractive modulator having individually controlled ribbons associated with individual pixels imaged onto a printing plate. One method for reducing artifacts transferred to a medium includes the steps of: determining values of intensity versus pulse width variations for each ribbon of the modulator based upon empirical data; weighting the determined values according to a predetermined weighting factor dependent upon physical, optical, chemical and structural characteristics of a printing plate to yield an image on the printing plate having minimum visible artifacts; and applying the weighted values to ribbon drivers of the modulator.

9 Claims, 7 Drawing Sheets

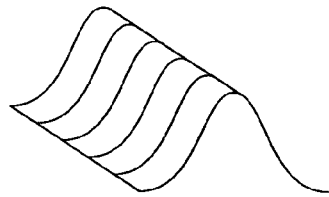
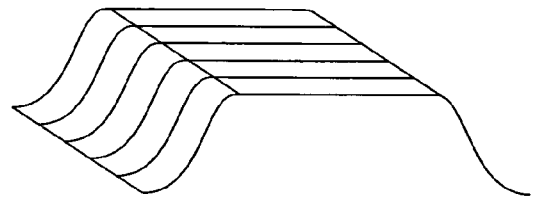
FIG. 7                FIG. 8
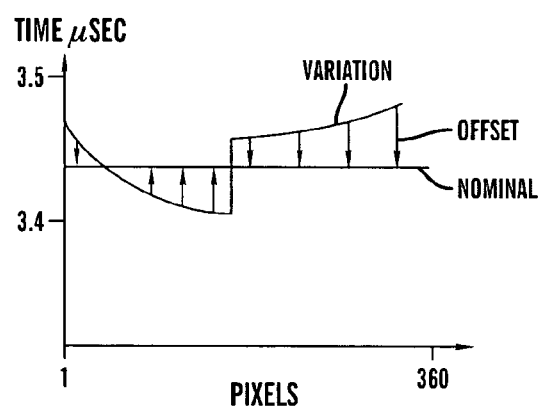
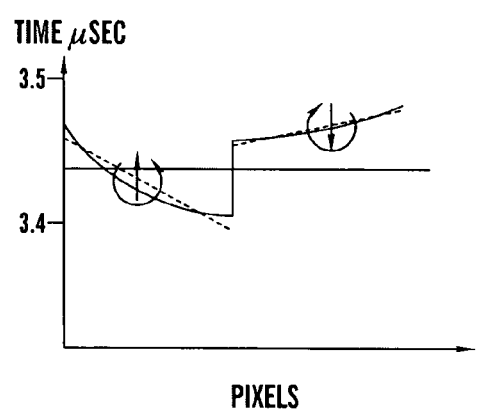
FIG. 9                FIG. 10

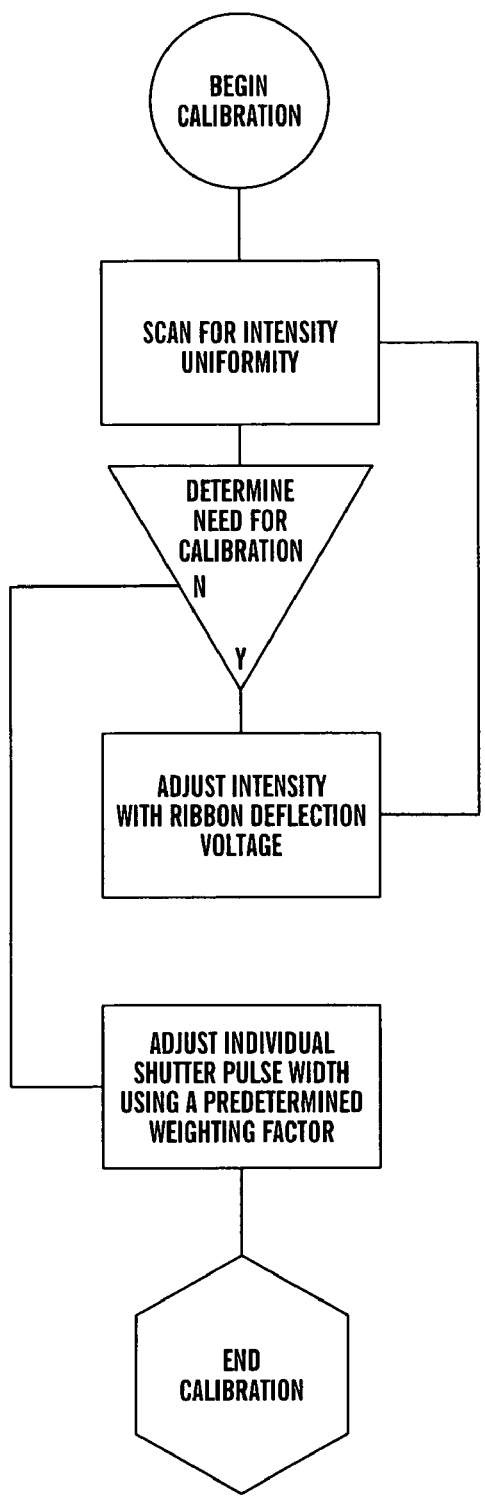 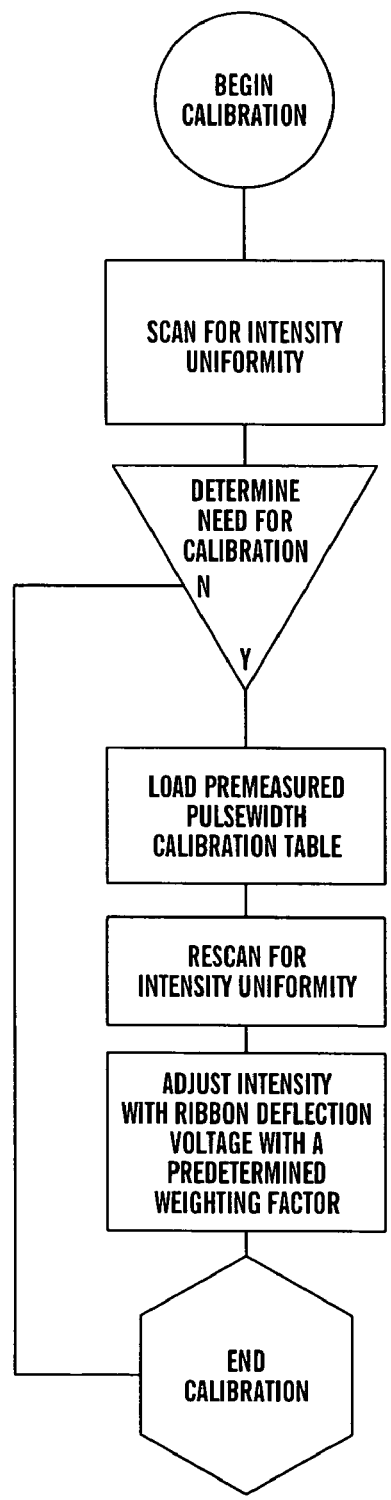
*FIG. 14*    *FIG. 15*

REDUCTION OF IMAGING ARTIFACTS IN A PLATESETTER HAVING A DIFFRACTIVE MODULATOR

BACKGROUND OF THE INVENTION

The invention relates generally to the recognition and solving of a previously unrecognized problem inherent in an optical imaging head that uses a diffractive modulator in a platesetter. More specifically, banding and other imaging artifacts are minimized.

With any image to be printed in the printing industry, a typical first step in the overall process is prepress operations, that is, to transform digital information representing the image of interest onto a light or thermal sensitive medium, e.g. a printing plate, which is then used to transfer the image any number of times on a printing press. As prepress technologies have evolved, the time required to create the image has been reduced while the quality of the image has improved. Also evolving is the media used for film, plates, proofing and final production. This evolution continues to drive the requirement for a faster, higher quality, imaging system capable of imaging on many different recording media.

One method for reducing imaging time is to increase the number of beams that write on the media at any one time. There exists in the art several methods for creating multiple writing beams from a single source. These previous methods include the use of a multi-channel acousto-optical modulator (AOM), various beam splitting technologies and multi-element modulators such as digital micromirror devices (DMD™ trademarked by Texas Instruments), and lanthanum modified lead zirconate titanate which can be fabricated as a transmissive ferroelectric ceramic modulator, also known as PLZTs.

One type of multi-element diffractive modulator, the grating light valve or GLV™, has been developed by Silicon Light Machines, Inc. of Sunnyvale, Calif. This GLV is an addressable diffraction grating, formed of moving parts on the surface of a silicon chip. Each GLV pixel consists of dual-supported parallel ribbons formed of silicon nitride and coated with a reflective aluminum top layer. Several publications are incorporated herein by reference in their entirety to provide supplemental background information on grating light valves which is not essential but is helpful in appreciating the applications of the present invention. They are: "Grating Light Valve™ Technology: Update and Novel Applications" by D. T. Amm et al., presented at Society for Information Display Symposium, May 19, 1998, Anaheim, Calif.; "Grating Light Valve™ Technology for Projection Displays" by R. W. Corrigan et al., presented at the International Display Workshop, Kobe Japan, Dec. 9, 1998, Paper Number LAD5-1; "Optical Performance of the Grating Light Valve Technology" by D. T. Amm et al., presented at Photonics West-Electronic Imaging, Jan. 27, 1999, San Jose, Calif.; and "Calibration of a Scanned Linear Grating Light Valve™ Projection System" by R. W. Corrigan et al., presented at Society for Information Display Symposium, May 18, 1999 in San Jose, Calif.

U.S. Pat. No. 6,229,650 issued May 8, 2001 to Reznichenko et al. discloses an optical imaging head for transferring an image onto a printing plate mounted on a drum surface of an internal or external drum platesetter. The optical imaging head as disclosed in the '650 patent includes: a line illumination module; a grating light valve; a first lens group; a second lens group; and a stop. The line illumination module generates a substantially uniform line of radiation and includes a bar of laser diodes, a fast axis collimating lens for evenly dispersing radiation in a fast axis direction, and a slow axis collimating lens for evenly dispersing the radiation in a slow axis direction. The grating light valve forms an object plane which receives the line of radiation from the line illumination module and generates diffractive orders of modulated radiation. The grating light valve includes (i) an addressable diffraction grating formed of moving parts on the surface of a silicon chip, and (ii) pixels of dual-supported parallel ribbons formed of silicon nitride and coated with a reflective aluminum top layer. The first lens group receives the modulated radiation and adjusts image magnification independent of image focus. The second lens group receives and passes the magnification-adjusted modulated radiation from the first lens group to the printing plate, and adjusts the image focus independent of image magnification. The stop, which is placed between the first and second lens groups, has a single aperture for (i) passing zero order diffractive magnification-adjusted modulated radiation from the first lens group to the printing plate, and (ii) blocking non-zero order diffractive magnification-adjusted modulated radiation from incidence with the printing plate.

SUMMARY OF THE INVENTION

A platesetter may have an optical imaging head which includes a diffractive modulator having individually controlled ribbons associated with individual pixels imaged onto a printing plate. One method for reducing artifacts transferred to a medium includes the steps of: determining values of intensity versus pulse width variations for each ribbon of the modulator based upon empirical data; weighting the determined values according to a predetermined weighting factor dependent upon physical, optical, chemical and structural characteristics of a printing plate to yield an image on the printing plate having minimum visible artifacts; and applying the weighted values to ribbon drivers of the modulator.

BRIEF DESCRIPTION OF THE DRAWINGS

The aforementioned aspects and other features of the invention are described in detail in conjunction with the accompanying drawings (not drawn to scale) in which the same reference numerals are used throughout for denoting corresponding elements and wherein:

FIG. 7 is a graphical representation of a line of illumination;

FIG. 8 is a graphical representation of a line of illumination over a predetermined pulse width;

FIG. 9 is a graphical representation of the number of pixels in a line of illumination versus pulse width variation in microseconds;

FIG. 10 is a linearized version of FIG. 9;

FIG. 14 is a flow chart of a method according to the principles of the invention; and FIG. 15 is a flow chart of another method according to the principles of the invention.

DETAILED DESCRIPTION OF THE PREFERRED EMBODIMENTS

Figure 1A:
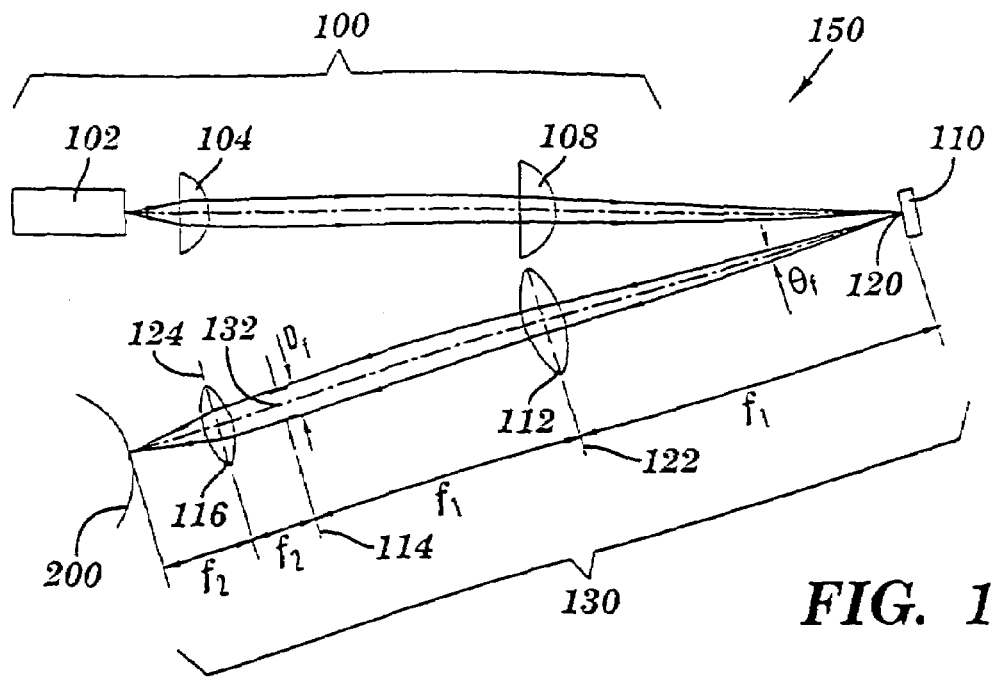
FIG. 1A is a side view optical diagram of an imaging head.
Figure 1B:
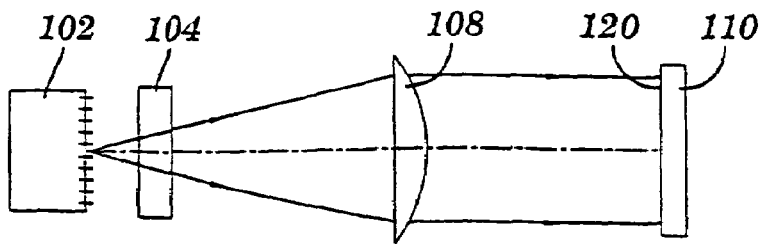
FIG. 1B is a top view optical diagram of an illumination system plus a grating light valve of the imaging head of FIG. 1A.
Figure 1C:
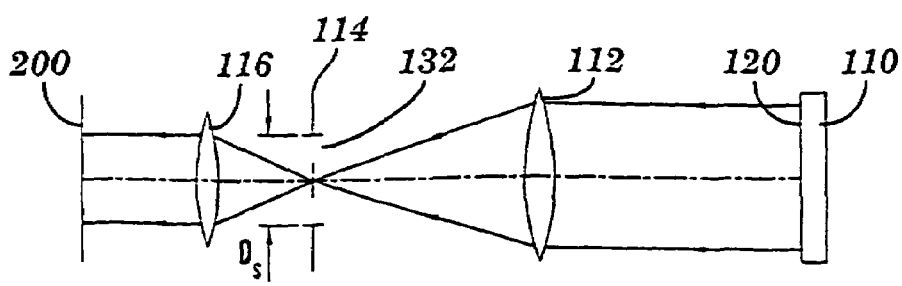
FIG. 1C is a top view optical diagram of an imaging system of the imaging head of FIG. 1A.

FIGS. 1A, 1B and 1C illustrate side and top views of a structure and operation of an optical imaging head 150 which can be separated into two basic parts, the illumination system 100 and the imaging system 130. The illumination system 100 generates and emits a line of continuous wave energy. The zero order diffractive imaging system 130 receives the continuous wave energy or radiation at the object plane 120 of the diffractive modulator 110, then transfers an image via zero order diffractive radiation through various components to an imaging medium.

The illumination system 100 takes the form of a line illumination module 100 which includes a bar 102 of laser diodes for generating multiple laser beams, a fast axis collimating lens 104 for evenly dispersing the radiation in a fast axis direction and a slow axis collimating lens 108 for evenly dispersing the radiation in a slow axis direction. The laser bar 102 is a group of laser diodes which emit laser beams to the fast axis collimating lens 104. The slow axis direction corresponds to the movement of the optical head along the longitudinal axis of an imaging drum which parallels the linear direction along the width W (see FIG. 2) of the medium 200, whereas the fast axis direction corresponds to the spinning of a laser beam along the radial direction of the drum, e.g. along a swath (N) of the medium 200.

The type of light source used is dependent upon the particular media. In one example, the medium 200 is thermally sensitive, so an appropriate laser light source is used for imaging on that media. However, other sources of electromagnetic energy could be used, as necessary, for various applications.

Figure 2A:
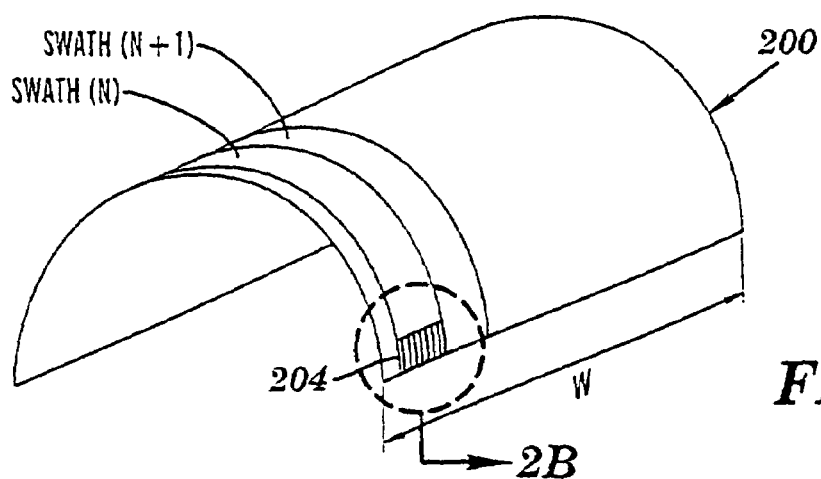
FIG. 2A is a perspective view of an image medium positioned for imaging on an external drum and recorded upon by the imaging head of FIG. 1A.
Figure 2B:
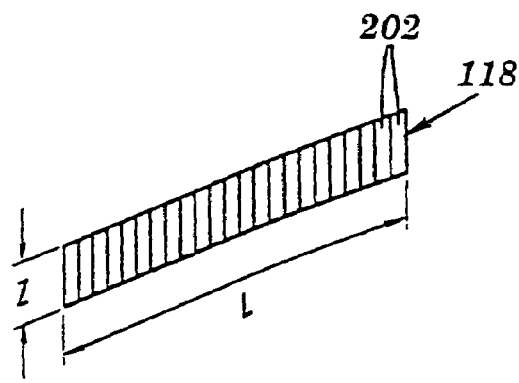
FIG. 2B is a representation of a line of illumination or line of radiation for transferring an image to a medium.

The medium 200, shown in FIG. 2, is positioned as supported on an external drum (not shown). A line of illumination 118 (also referred to as a line of radiation), which is coincident with the medium 200 at the image plane, has a length L and a width Z. Each line of illumination 118 contains a predetermined number of sections 202 which, respectively, correspond to some number of pixels on the diffractive modulator 110. The line of illumination 118 is imaged at an initial position 204 along a first swath (N) on the sheet of medium 200. As the drum rotates, pixels along the line of illumination 118 are turned ON or OFF according to image information supplied by control electronics as well known in the art. Modulation of pixels is synchronized to the rotational speed of the drum. This procedure continues until imaging is complete on swath (N). The movement of the line of illumination 118 from swath (N) to (N+1) is facilitated by movement of the imaging head along the longitudinal axis (i.e. the slow axis) of the rotating drum. Then, the above-described imaging procedure is repeated for swath (N+1) and all additional swaths until the image is completely transferred onto the medium 200. The imaging procedure could also be accomplished by other means such as a spiral scan of the media as well known in the art.

One preferred diffractive modulator 110 is the previously described GLV. The GLV operates by diffracting light with the use of moveable ribbons in an array.

Energy from the modulator reaches the image plane when a modulator pixel or ribbon is not activated. When a pixel is fully activated, i.e. when alternate ribbons are deflected approximately one-quarter wavelength, then light is diffracted and subsequently blocked from reaching the image plane. Pixels may be partially activated to control the amount of light reaching the image plane.

For example, a GLV may consist of 1088 individually addressable pixels. A one-dimensional GLV array can be used, although a two dimensional GLV could be used if desired to create an area of illumination rather than a line of illumination.

Various imaging resolutions are available by changing the grouping of the GLV pixels. Also, all pixels of the GLV need not necessarily be used in the formation of an image. For example, if 720 GLV pixels are imaged one-for-one at the image plane to produce a resolution of 2400 image pixels (i.e. writing dots) per inch, then a grouping of two GLV pixels per image plane pixel results in 360 writing dots at a resolution of 1200 dots per inch.

No additional moving parts are required to change spot size (i.e. the writing dots or image pixels) other than to select the number of GLV pixels for the desired resolution. Moreover, with constant illumination of the GLV, the energy at the image plane remains constant in terms of energy per unit area, thereby requiring no exposure energy changes with change in resolution. This provides a benefit over systems using optical demagnification to change addressability. With optical demagnification, the power in the imaging spot must be reduced proportionally to the change in spot size causing more power to be discarded and slowing down the system by the same proportion. Throughput remains constant as the power is spread over proportionally more pixels. Other combinations of ribbons can be selected on the GLV with the appropriate demagnification selection. In each case the time of activation of each pixel is varied directly with the resolution selected while the scanning velocity remains constant.

The imaging system 130 includes the grating light valve 110, a first magnification lens group 112, a stop 114 containing an aperture 132, and a second focusing lens group 116. The grating light valve used here allows each pixel 202 to be separately and individually controlled in accordance with signals from control electronics built into the GLV modulator 110. In other words, individual image pixels 202 can be separately diffracted. Furthermore, the intensity of each GLV pixel can be electronically controlled by varying the voltage applied to the ribbons, thus controlling their deflection and ultimately the amount of energy that reaches the image plane. Varying the intensity of GLV pixels on the GLV object plane 120 can correct non-uniformity of the line of illumination on the image plane.

Figure 3:
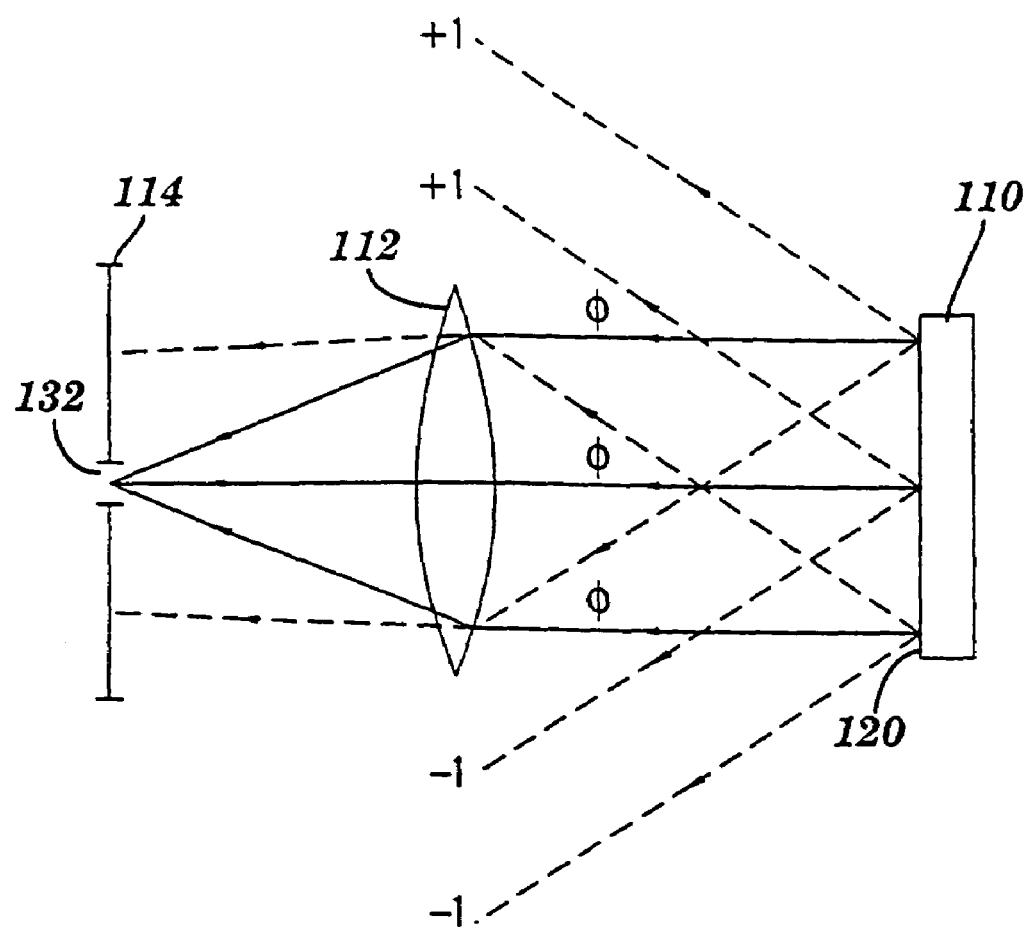
FIG. 3 is a diagram which illustrates zero and first order diffractive rays traversing between selected components of the imaging head of FIG. 1A.

The surface 120 of the grating light valve 110 includes a diffraction grating, i.e. an array of narrow parallel slits or openings which, when white light is projected therethrough, breaks down the white light into all the colors of the spectrum due to the diffraction of light waves as they pass through the openings. The diffraction grating produces this spectral effect due to the reinforcement of the light waves from adjacent slits or openings. FIG. 3 illustrates the effect of the diffraction grating surface 120 on white light received from the light source 102.

Turning to FIG. 3, selected components of the imaging head 150 of FIG. 1A are depicted to illustrate diffraction of light from the surface 120 of the grating light valve 110. Zero order diffracted light is represented by solid lines whereas, positive and negative first order diffracted light is represented by dotted lines. Higher diffractive orders are omitted for simplicity.

Figure 1D:
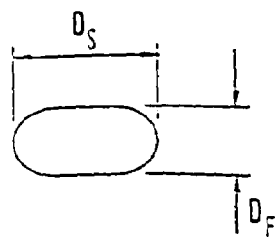
FIG. 1D is a diagram of an elliptically shaped aperture for use in the imaging head of FIG. 1A.

The zero order diffracted light reflected from the object plane 120 of the GLV 110 passes through the first lens group 112 and is directed to, and passes through, the aperture 132. The first lens group 112 includes at least one fixed lens and at least one adjustable lens for adjusting the image magnification independent of the image focus. The aperture 132 is a single centrally located opening (preferably having an elliptical shape as shown in FIG. 1D) on the stop 114. The stop 114 blocks non-zero order diffractive rays while allowing zero order diffractive rays to pass through the aperture 132.

The principal rays of zero order radiation received from the first lens group 112 are focused in the center of the aperture 132, and passed to the second lens group 116 (see FIG. 1C). The second lens group 116 includes one or more lenses for adjusting the image focus independent of the image magnification. The second lens group 116 must contain at least one adjustable lens, and could contain zero, one or more fixed lenses. From the second lens group 116, the rays are focused along a line of radiation 118 (see FIG. 2) on the imaging medium 200.

When compared to the use of higher order diffracted light, the use of zero order diffracted light produces several benefits. Depth of focus is reduced. Also, the optical design is simplified since only a single aperture is used to pass zero order diffracted light. In contrast, multiple apertures and additional optical components are required for passing higher order diffracted light. Additional lens groups are required to collect first or higher order diffracted light. Furthermore, using zero order diffracted light increases resolution while concurrently improving image quality. No significant grey scale adjustment is necessary for imaging with zero order diffracted light.

One drawback that a zero order diffraction system has when compared to a first order diffraction system is lower contrast ratio and dynamic range. However, the thermal media used is not sensitive to these parameters.

The optical layout of the imaging system 130 as illustrated in FIG. 1A will separate the various diffractive orders of the radiation received from the illumination system 100. Specifically, the size of the elliptical opening 132 (shown in FIG. 1D) is calculated as, $$Df=(-\Theta f*f1) \quad (1)$$

$$Ds=(-\Theta s*f1) \quad (2)$$

where:
f1 is the focal length of the first (magnification control) lens group 112;
Θf is the diverging angle of the line of radiation in the fast axis direction from the GLV (see FIG. 1A);
Θs is the diverging angle of the line of radiation in the slow axis direction from the GLV (see FIG. 1C);
Df is the diameter of the ellipse in the fast axis direction; and
Ds is the diameter of the ellipse in the slow axis direction.

In the given optical system, the aperture is positioned to be at a distance equivalent to the focal length f1 of the first lens group 112 away from the principal plane of the first lens group 122. Maintaining the distance between the first lens group 112 and the object plane 120 of the modulator 110 is important for cleanly separating the diffractive orders.

The imaging head can be a dual telecentric imaging system. Telecentricity occurs when rays are normal to an incident surface. Prior art imaging systems sometimes exhibit singular telecentricity of the rays at the imaging plane. The benefit of having an imaging system with dual telecentricity is to separate diffractive orders and separate magnification adjustments from focusing adjustments. The imaging system 130 of the optical head 150 is shown in a dual telecentric arrangement. The imaging system is comprised of two lens groups, first lens group 112 and second lens group 116. Lens group 112 has an effective focal length equal to f1 and lens group 116 has an effective focal length equal to f2. Dual telecentricity is achieved when the perpendicular distance between the principal planes of lens groups 112 and 116 is equal to f1+f2, and the aperture 132 is positioned at a common focal plane, i.e. where the aperture is a distance f1 from the first lens group 122 and a distance f2 from the second lens group 116. With a dual telecentric arrangement, magnification of the system is insensitive to movements of the GLV 110 or imaging medium 200.

Another advantage of the exemplary optical system is that either magnification or focus can be adjusted independent of one another. With lens group 112 positioned a distance f1 from the object plane 120, lens group 116 positioned a distance f2 from the image plane 200 and the distance between first and second lens groups to be the distance f1+f2, the ratio (f2/f1) sets the magnification of the imaging system 130. The magnification is adjusted by moving one or more elements of the first lens group 112. The focus of the system is adjusted by moving one or more elements of the second lens group 116.

Every emitter of the diode bar 102 illuminates the entire object plane 120 of the GLV 110. This provides an advantage in that the energy distribution across the object plane 120 is smoothed by the contributions from each diode. The long, matched focal lengths of the illumination system 100 have the effect of reducing the divergence of the energy reflected from the GLV 110, which, in turn, improves the depth of focus of the imaging system 130.

One could alter the system illustrated in FIG. 1A to write using first order diffractive rays while blocking zero order diffractive rays. Similarly, the system could be designed to operate with either even or odd order diffractive light. Also variable is the ratio of shutters, ribbons or GLV pixels in the GLV to pixels on the image plane. In one example, each pixel on the image plane corresponds to two GLV pixels. In another example each image plane pixel corresponds to a single GLV ribbon.

The optical imaging head 150 can be used with an external drum imagesetter or platesetter, so that the image is transferred onto a medium supported by the external surface of the drum. The optical imaging head 150 could also be used in direct-to-press imaging to project the line of illumination 118 directly onto a plate cylinder of a printing press. In this case, the head would be replicated at each station of the printing press. Furthermore, while the head is most appropriately used in the above-described applications, it may also be used in an internal drum or capstan style imagesetter or platesetter.

Due to the fact that a large number of pixels are used to create the GLV 110, it is possible to advantageously employ some number of pixels for uses other than as writing beams without incurring a penalty. These other uses include sourcing beams (1) to detect the edge of a plate so as to synchronize the image location with the position of the recording medium, or (2) to sense or to automatically adjust the focus of an imaging system.

The fact that individual GLV pixels may be actuated to different levels of diffraction efficiency can be used to great advantage. A first possible use is to equalize the energy distribution across the GLV. If a nominal energy level is set below the maximum, then individual pixels can be adjusted either up or down to cause all pixels to be equal. A second use is to desensitize the effects of pixel placement errors at the boundary between bands of multiple pixels. The pixels located at the boundary between the swaths of multiple pixels can be lowered in intensity and overlapped so as to average the effective position.

Adjusting each ribbon corresponding to a GLV pixel is accomplished by individually controlled ribbon drivers. As the voltage applied to each ribbon driver is varied so too will the diffraction, position and pulse width of the specific ribbon be changed. The GLV ribbons are also referred to as shutters and any adjustment to the driver voltage for a given ribbon will cause the ribbon to either move upwards or downwards, resulting in a change of intensity, diffraction and pulse width for the corresponding image pixel.

There are other advantages of using the above-described GLV in an optical imaging head. For instance, manufacture of the GLV is cost effective compared with manufacture of other light modulators since the fabrication of the GLV uses standard fabrication methods employed in the semiconductor industry. Also, the pixels of the GLV are accurately located to tight semiconductor standards. The GLV is capable of modulating high power levels of radiation. Moreover, the reflective GLV results in a more compact system as compared to an in-line multiple beam system. A transmissive modulator could be used to replace the GLV, but one of the trade-offs would be a physically larger system. Due to the scale and materials employed, the GLV is inherently insensitive to damage from shock and vibration. The GLV is also sealed and insignificantly stressed in use, resulting in high reliability. Due to the fact that the GLV pixels can be pulled down to different levels, the GLV can be used with different wavelength sources. The GLV can also be used with both multi-mode and single mode lasers. Further, as compared to single beam methods of writing images, the adjacency of the pixels produced by the GLV reduces the power required to write equivalent images.

An imaging head for a platesetter will include a number, perhaps 360, of individual modulatable pixels, formed as the image of the GLV relayed to the print medium. Grouped together, the pixels form a substantially continuous line of illumination (see FIG. 7), with intensity uniformity as dictated by the laser that illuminates the GLV. Moving the line of illumination (see FIG. 8) forms an image. Individual pixels are modulated in accordance to the image data supplied to create a two-dimensional image.

Figure 5A:
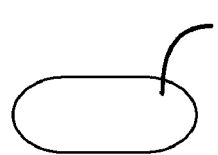
FIG. 5A is a representation of an ideal spot to be imaged on a medium when the intensity level across a line of illumination is consistent.
Figure 5B:
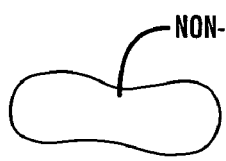
FIG. 5B is a representation of an actual spot to be imaged, prior to correction, when the intensity level across a line of illumination in inconsistent.

If the laser illuminating the GLV were perfect, then an image formed by actuating every other arm of the GLV would result in equivalent, symmetrical imaged areas or spots on a film or plate as depicted in FIG. 5a. If the laser has intensity variation, then the spots would assume undesirable asymmetric shapes as depicted in 5b. The undesirably shaped spots would result in banding artifacts in the final printed image. Depending on the shapes of the spots, intensity variation of 5 to 10% of the peak intensity could result in objectionable images.

Figure 4:
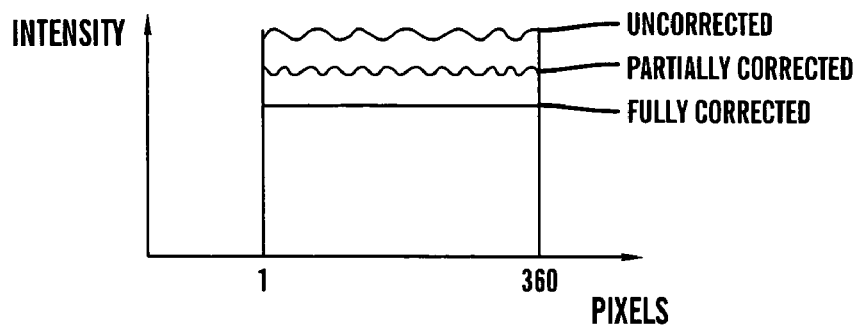
FIG. 4 is a graphical representation of a line of illumination for transferring an image to a medium.
Figure 6:
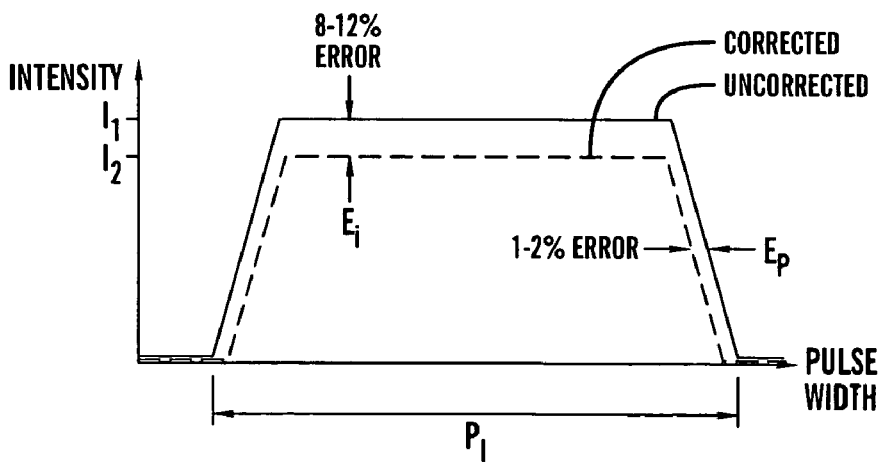
FIG. 6 is a graphical representation of a line of illumination before and after intensity correction.

As described earlier, it is possible to correct for non-uniformity of the laser illumination by varying the actuation levels of the individual GLV pixels. As shown in FIG. 4, the amplitudes of the individual pixels are either partially or fully corrected. MEMS type modulators such as the GLV allow variable actuation. It is known that adjustments in the actuation level result in slight variation in the actuation time of pixels. That is, two pixels that have different actuation levels, when actuated during the same time frame, will actually require a slightly different amount of time to go from ON to OFF. This variation in pulse width is shown in FIG. 6. One source of this pulse width variation is the drivers within the modulator, resulting in driver-inherent pulse width variations.

In the past, it was believed that the pulse width variation was insignificant. For example, when the GLV or some other type of light modulator was used to create projection displays, no correction for pulse width variation was required. It has been discovered, however, that when used to record images, especially on thermal sensitive media, pulse width error on the order of 1 to 2% can produce objectionable visible artifacts. Thus, if a full intensity correction is applied, a detrimental amount of pulse width variation is added.

An improved method of obtaining uniform images is to make a partial correction for intensity variation. For example, given a starting non-uniformity of 15%, a partial correction called damping is applied on a pixel by pixel basis that is a percentage of the amount that would result in a full correction. The correction percentage that is used is an amount determined to yield less than a predetermined amount of pulse width variation which would otherwise yield undesirable artifacts. The resultant image is improved by concomitantly having more uniform intensity and less, effectively an insignificant, pulse width variation.

This partial correction or damping can be implemented by a weighting factor that is used on all pixels of the image as a trade-off between intensity and pulse-width corrections to provide a clear image with minimum artifacts.

The low tolerance to pulse width variation gives rise to another problem with MEMS type modulators. As the modulator is manufactured with semiconductor fabrication methods, variations in the performance across the GLV result. Each pixel of the GLV has a response time that is a function of the electrical characteristics of the driver for that pixel. It is not uncommon for slight differences to exist between the individual drive channels. These differences will result in pulse width variations, which can cause undesirable artifacts on final printed images. FIG. 10 shows a typical resultant pulse width variation along the GLV for a constant pixel actuation level.

The performance of the GLV can be improved by measuring the device for pulse width and intensity performance in the field, or prior to assembly into the imaging system. Correction factors are then established to equalize the pulse width and intensity variations on a pixel by pixel basis. These correction factors can be implemented in several ways. One such correction factor is a pixel by pixel offset (FIG. 9). Another would be to fit a straight line over segments of the measured pulse width curve and calculate a correction based upon the slope and offset of the linear line (FIG. 10). The latter has the advantage of requiring fewer variables for correction.

The intensity and pulse width calibration are performed upon request by an operator or a service technician in the field. Each imaging head, including the diffractive modulator, is separately calibrated. The optics for performing the necessary calibrations are resident in the imaging head and the software for controlling the calibration schemes is resident in the control units for the platesetter. Alternatively, the calibration routines can be executed in the factory during set-up and testing of the platesetter and imaging head.

The method of FIG. 14 for calibrating the imaging head of a platesetter can be implemented at any time. The method reduces artifacts of an image transferred to a printing plate in a platesetter having an imaging head with a diffractive modulator having ribbons. The method includes the steps of:

(A) providing a laser line of illumination from the imaging head via the modulator to the medium;

(B) determining whether intensity calibration is required to provide a substantially uniform laser intensity on the printing plate;

(C) if calibration is required in step (B), adjusting driver voltages for controlling each ribbon of the modulator to obtain substantially uniform laser intensity, then repeating step (B); and (D) if calibration is not required in step (B), adjusting individual ribbon pulse widths using a predetermined weighting factor based on printing plate characteristics.

Figure 11:
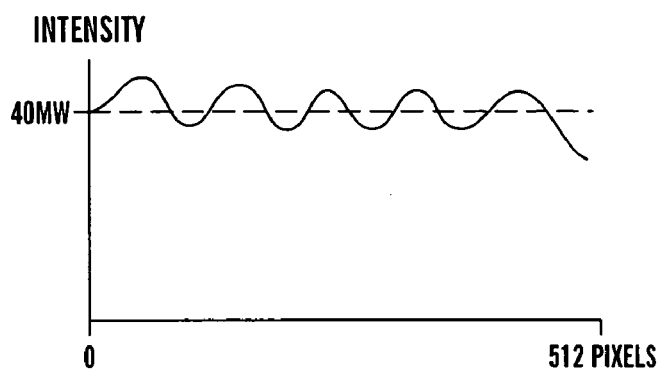
FIG. 11 is a graphical representation of pixels of an image versus laser intensity levels per pixel in milliwatts.
Figure 12:
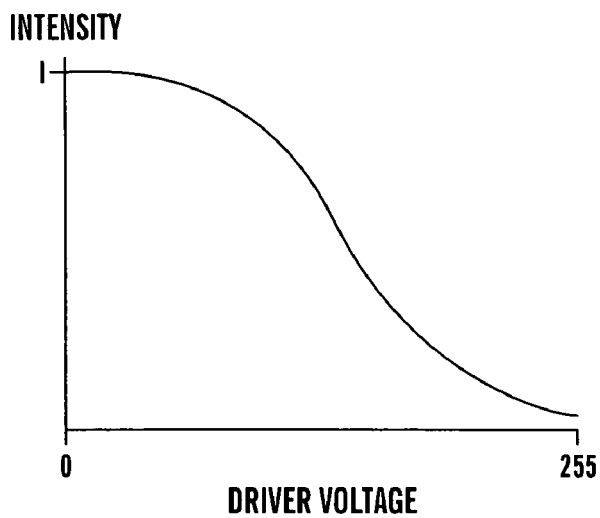
FIG. 12 is a graphical representation of digitally encoded diffractive modulator driver voltages versus laser intensity levels.

The laser line of illumination may be provided by a line illumination module within the imaging head. FIG. 11 represents laser intensity or power for each pixel, for example along a GLV diffractive modulator having 512 ribbons. As you can see, fluctuations in intensity must be corrected to yield a substantially uniform laser intensity for imaging. The intensity value is dependent upon the requirement of the media for imaging. In this example, the uniform laser intensity is 40 mw plus or minus some acceptable deviation which will not noticeably effect the resultant image. If the laser intensity for each pixel of the GLV is within a predetermined acceptable limit for the media, e.g. 40 mw±2%, then no intensity calibration is necessary. If intensity calibration is required, then driver voltages are adjusted accordingly for each ribbon driver of the GLV. For example, FIG. 12 represents driver voltages (0-255) versus digital-to-analog (DAC) converter values which in turn relate to laser intensities. Thereafter, the imaging head is again tested to determine whether intensity calibration is required and the above steps are repeated as necessary.

Figure 13:
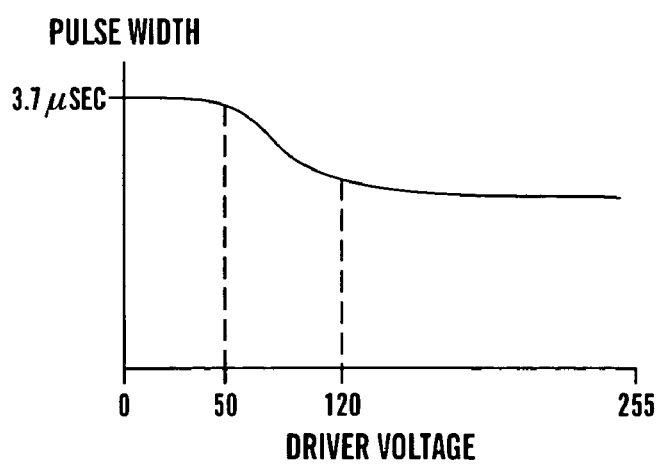
FIG. 13 is a graphical representation of digitally encoded diffractive modulator driver voltages versus pulse widths in microseconds.

A table of pulse width correction values is populated for the shutters of the GLV modulator. This table can be populated prior to or during the GLV calibration routine. FIG. 13 represents shutter driver voltages (0-255) versus pulse widths in microseconds for each GLV pixel. In this particular example, the maximum pulse width is 3.7 microseconds when the driver voltage is set to zero. At a driver voltage of about 50, the pulse width begins to decline until it settles at a low value corresponding to a driver voltage of 120.

Once the above-described laser intensity calibration has been satisfactorily completed, then individual ribbon pulse widths are altered according to a predetermined weighting factor that amounts to a trade-off between intensity and pulse-width corrections. The predetermined weighting factor is predetermined from test data gathered for each specific type of printing plate since the material and structural characteristics will differ for different types of printing plates. For example, one weighting factor may be 0.15, meaning that 15% of the table of pulse width correction values will be applied to the driver voltages of the GLV ribbons.

When calibrating the imaging head in a factory setting, the method of FIG. 15 can be used. The method reduces artifacts of an image transferred to a printing plate in a platesetter having an imaging head with a diffractive modulator having ribbons. The method includes the steps of:

(A) gathering and storing empirical data of shutter driver voltages versus pulse width values for each pixel of the image;

(B) providing a laser line of illumination from the imaging head via the modulator to the medium;

(C) determining whether intensity calibration is required to provide a substantially uniform laser intensity on the printing plate; and (D) if calibration is required in step (C), applying the empirical data for ribbon driver voltages with a predetermined weighting factor.

In this method, the table of pulse width correction values is first populated for the ribbons of the GLV modulator as described above. The table is populated prior to the GLV calibration routine.

The laser line of illumination is provided to the image plane by a line illumination module within the imaging head, and a determination is made whether the intensity levels require calibration. If calibration is required, then the pulse width correction values are weighted and applied to modify the ribbon driver voltages.

The above-described embodiments are merely illustrative of the present invention and represent a limited number of the possible specific embodiments devised from the principles of the invention as claimed. For example, the grating light valve or GLV has been illustrated in detail in the above examples. However, the GLV is but one of many diffractive modulators that require corrective measures for intensity and pulse width variation as described herein and claimed hereinafter.

The invention claimed is:

1. A method for reducing artifacts of an image transferred to a printing plate in a platesetter having an imaging head with a diffractive modulator having ribbons, the method comprising the steps of:

(A) providing a laser line of illumination from the imaging head via the modulator to the medium;

(B) determining whether intensity calibration is required to provide a substantially uniform laser intensity on the printing plate;

(C) if calibration is required in step (B) adjusting driver voltages for controlling each ribbon of the modulator to obtain substantially uniform laser intensity, then repeating step (B); and (D) if calibration is not required in step (B), adjusting individual ribbon pulse widths using a predetermined weighting factor based on printing plate characteristics.

2. The method of claim 1, wherein the diffractive modulator is a grating light valve.

3. The method of claim 1, wherein the diffractive modulator is either transmissive or reflective.

4. A method for reducing artifacts of an image transferred to a printing plate in a platesetter having an imaging head with a diffractive modulator having ribbons, the method comprising the steps of:
  (A) gathering and storing empirical data of ribbon driver voltages versus pulse width values for each pixel of the image;
  (B) providing a laser line of illumination from the imaging head via the modulator to the medium;
  (C) determining whether intensity calibration is required to provide a substantially uniform laser intensity on the printing plate; and
  (D) if calibration is required in step (C), applying the empirical data for ribbon driver voltages with a predetermined weighting factor.

5. The method of claim 4, wherein the diffractive modulator is a grating light valve.

6. The method of claim 4, wherein the diffractive modulator is either transmissive or reflective.

7. In a platesetter having an optical imaging head with a diffractive modulator having ribbons, a method for reducing artifacts transferred to a medium comprising the steps of:
  determining values of intensity versus pulse width variations for each ribbon of the modulator based upon empirical data;
  weighting the determined values according to a predetermined weighting factor dependent upon physical, optical, chemical and structural characteristics of a printing plate to yield an image on the printing plate having minimum visible artifacts; and
  applying the weighted values to ribbon drivers of the modulator.

8. The method of claim 7, wherein the diffractive modulator is a grating light valve.

9. The method of claim 7, wherein the diffractive modulator is either transmissive or reflective.

* * * * *